US 6,653,162 B2

(12) United States Patent
Kim et al.

(10) Patent No.: US 6,653,162 B2
(45) Date of Patent: Nov. 25, 2003

(54) FABRICATION METHOD OF OPTICAL DEVICE HAVING CURRENT BLOCKING LAYER OF BURIED RIDGE STRUCTURE

(75) Inventors: Sung Bock Kim, Taejon (KR); Jeong Soo Kim, Chungcheongnam-Do (KR)

(73) Assignees: Electronics and Telecommunications Research Institute, Taejon (KR); Korea Telecom, Kyoungki-Do (KR)

( * ) Notice: Subject to any disclaimer, the term of this patent is extended or adjusted under 35 U.S.C. 154(b) by 0 days.

(21) Appl. No.: 10/115,696

(22) Filed: Apr. 3, 2002

(65) Prior Publication Data

US 2002/0145149 A1 Oct. 10, 2002

(30) Foreign Application Priority Data

Apr. 6, 2001 (KR) .................................... 2001-0018215

(51) Int. Cl.[7] .......................... H01L 21/00; H01L 33/00; H03S 5/00
(52) U.S. Cl. .............................. 438/46; 438/40; 438/41; 438/44; 257/94; 257/96; 372/45; 372/46
(58) Field of Search ................... 438/39.4, 41, 44.46; 372/43, 45, 46, 47, 49; 257/94.96

(56) References Cited

U.S. PATENT DOCUMENTS 5,452,315 A  9/1995 Kimura et al.

5,665,612 A  9/1997 Lee et al. ..................... 438/40
5,748,659 A  5/1998 Kimura et al.

FOREIGN PATENT DOCUMENTS

KR  1020000000664  1/2000  ............. H01S/3/18

OTHER PUBLICATIONS

Jpn. J. Appl. Phys. vol. 35, Pt. 1, No. 2, High–Performance Strain–Compensated Multple Quantum Well Planar Buried Heterostructure Laser Diodes with Low Current, H. Cho, et al. 7 pages.

*Primary Examiner*—Tom Thomas
*Assistant Examiner*—Donghee Kang
(74) *Attorney, Agent, or Firm*—Blakely, Sokoloff, Taylor & Zafman

(57) ABSTRACT

An optical device having a current blocking layer of a buried ridge structure and a fabrication method thereof are disclosed. This invention reduces a leakage current between active layer and ion implant layer in buried ridge structure. To minimize leakage current, a P-N-P current blocking layer and an ion implanting current blocking layer are combined. An optical device of the present invention includes: active layers of a mesa structure in a predetermined region on a substrate; a first current blocking layer of a P-N-P structure, which is placed to cover the mesa structure; and a second current blocking layer of a buried ridge structure, which is placed to surround the environs of the first current blocking layer.

3 Claims, 9 Drawing Sheets

FABRICATION METHOD OF OPTICAL DEVICE HAVING CURRENT BLOCKING LAYER OF BURIED RIDGE STRUCTURE

FIELD OF THE INVENTION

The present invention relates to an optical device; and, more particularly, to a current blocking layer structure of an optical device having a buried ridge structure (BRS) and a fabrication method thereof.

DESCRIPTION OF RELATED ART

Generally, optical devices used for an optical fiber communication, e.g., a high-performance semiconductor laser diode (LD) or a semiconductor optical amplifier (SOA), requires a low threshold current and high quantum efficiency, and for this, leakage current should be minimized.

To minimize the leakage current, semiconductor lasers using a planar buried heterostructure (PBH) and a buried ridge structure (BRS) are used. The optical source and the optical amplifier used in the optical fiber communication need to be high-powered, highly reliable and perform at a high speed. Therefore, it is necessary to optimize a current blocking layer used in these structures.

To form such a current blocking layer, three methods are used commonly.

The first method is what uses a P-N-P current blocking structure. It is based on a principle that when an electric current is supplied to an electrode, the current is blocked because other parts except an active layer is supplied with a reverse bias, while the active-layer receives a forward bias. This is a first conventional method to be described below.

Secondly, there is a method that grows a semi-insulation layer and uses it as a current blocking layer. As for the semi-insulation layer, iron (Fe) is usually doped and used. This is a second conventional method that will be also described later on.

The third conventional method is to implant hydrogen ions into the parts except the active layer and block a current.

<Conventional Method 1>

FIGS. 1A to 1E are cross-sectional views illustrating a first method for fabricating a conventional optical device of a planar buried heterostructure having a P-N-P current blocking layer.

First, as described in FIG. 1A, an active layer 102 of a heterostructure and a p-InP layer 103 are grown on an n-InP substrate 101 with a liquid phase epitaxy (LPE) or a metalorganic chemical vapor deposition (MOCVD), and an insulation layer mask 104 for a mesa-etching is formed on top of the p-InP layer 103 in a photolithography etching process.

Subsequently, as shown in FIG. 1B, the p-InP layer 103, the active layer 102 and a part of the n-InP substrate 101 are etched by using the insulation layer mask 104, but a mesa structure is formed through the processes of dry-etching and wet-etching.

Subsequently, as depicted in FIG. 1C, to confine the current and optical ray of the active layer 102, a p-InP 105 and an n-InP 106 are grown again in the LPE or MOCVD method.

Subsequently, as illustrated in FIG. 1D, after removing the insulation layer mask 104 used for the mesa-etching, a p-InGaAs layer 108 for ohm($\Omega$)-contacting with a p-InP clad layer 107 is grown again in the LPE or the MOCVD method.

Subsequently, as described in FIG. 1E, the region overlapped with the upper part of the active layer 102 is open by depositing an insulation layer 109 on the p-InGaAs layer 108 and performing a photolithography etching process, and a p-electrode 110 and an n-electrode 111 are formed to contact with the p-InGaAs layer 108 and the n-InP substrate 101, respectively.

In the first conventional method described above, in case of a one-layer waveguide, the good static characteristics can be obtained by re-growing the P-N-P. However, in case that the waveguide is of complicated structure with two or more layers in the vertical direction for the integration of an optical device, it is not only hard to re-grow the P-N-P current blocking structure, but a problem of increasing leakage current is raised, even if the P-N-P is re-grown.

<Conventional Method 2>

FIGS. 2A to 2E are cross-sectional views describing a second method for fabricating a conventional optical device of a planar buried heterostructure having a semi-insulation current blocking layer.

First, as illustrated in FIG. 2A, an active layer 202 and a p-InP layer 203 are grown on an n-InP substrate 201 in a liquid phase epitaxy (LPE) or a metalorganic chemical vapor deposition (MOCVD) method, and an insulation layer mask 204 for the mesa-etching is formed on top of the p-InP layer 203 in a photolithography etching process.

Subsequently, as shown in FIG. 2B, the p-InP layer 203, the active layer 202 and a part of the n-InP substrate 201 are etched by using the insulation layer mask 204, but a mesa structure is formed through the processes of dry-etching and wet-etching.

Subsequently, as depicted in FIG. 2C, to confine the current and optical ray of the active layer 202, a semi-insulation InP current blocking layer 205 is grown again in the LPE or MOCVD method.

Subsequently, as illustrated in FIG. 2D, after removing the insulation layer mask 204 used for the mesa-etching, a p-InGaAs layer 207 for ohm($\Omega$)-contacting with a p-InP clad layer 206 is grown again in the LPE or the MOCVD method.

Subsequently, as described in FIG. 2E, the region overlapped with the upper part of the active layer 202 is open by depositing an insulation layer 208 on the p-InGaAs layer 207 and performing a photolithography etching process, and a p-electrode 209 and an n-electrode 210 are formed to contact with the p-InGaAs layer 207 and the n-InP substrate 201, respectively.

The second conventional method described above has advantages that it solves the problem of increasing parasitic capacitance, which is caused in the aforedescribed first conventional method, and improves the property of high-speed modulation, and that it simplifies the processes.

However, since the semi-insulation layer used as a current blocking layer works as a deep level center in which holes and electrons are combined, it is more likely to work as a path for leakage current than as a current blocking layer. Also, there is a problem that the performance of the active layer is degraded due to the diffusion of iron (Fe), which is used as a doping impurity for forming a semi-insulation layer.

<Conventional Method 3>

FIGS. 3A to 3E are cross-sectional views showing a third method for fabricating a conventional optical device of a buried ridge structure having a current blocking layer using a hydrogen ion implantation method.

First, as illustrated in FIG. 3A, an active layer 302 and a p-InP layer 303 are grown on an n-InP substrate 301 in a liquid phase epitaxy (LPE) or a metalorganic chemical vapor deposition (MOCVD) method, and an insulation layer mask 304 for the mesa-etching is formed on top of the p-InP layer 303 in a photolithography etching process.

Subsequently, as shown in FIG. 3B, the p-InP layer 303, the active layer 302 and a part of the n-InP substrate 301 are etched by using the insulation layer mask 304, but a mesa structure is formed through the processes of dry-etching and wet-etching.

Subsequently, as depicted in FIG. 3C, to confine the current and optical ray of the active layer 302, the insulation layer mask 304 is removed and a p-InGaAs layer 306 is grown again to ohm-contact with a p-InP clad layer 305 in the LPE or MOCVD method.

Subsequently, as illustrated in FIG. 3D, to form a current blocking layer using hydrogen ion implantation, a hydrogen ion blocking mask 307 is formed overlapped with the active layer 302 in a photolithography etching process, and a current blocking layer 308 is formed by using the hydrogen ion implantation method.

Subsequently, as described in FIG. 3E, after removing the hydrogen ion blocking mask 307, a region overlapped with the upper part of the active layer 302 is open by depositing an insulation layer 309 on the p-InGaAs layer 306 and performing a photolithography etching process, and a p-electrode 310 and an n-electrode 311 are formed to contact with the p-InGaAs layer 306 and the n-InP substrate 301, respectively.

The third conventional method described above has an advantage of simplifying the fabrication process.

However, since it uses hydrogen ions injected to the current blocking layer, the width of the current blocking layer by the implantation of the hydrogen ions is 10 µm, whereas the width of the active layer is 1~2 µm, and thus the p-clad layer surrounds the active layer. This has a positive effect that the current and optical ray is confined in the active layer as well as a negative effect that it works as a path for leakage current.

SUMMARY OF THE INVENTION

It is, therefore, an object of the present invention to provide an optical device having a current blocking structure that can be favorably applied to a multi-layer waveguide structure as well as an advantage of low leakage current.

It is another object of the present invention to provide a method for fabricating an optical device, which can reproduce optical devices relatively comfortably.

In accordance with an aspect of the present invention, there is provided an optical device, including: active layers of a mesa structure in a predetermined region on a substrate; a first current blocking layer of a P-N-P structure, which is placed to cover the mesa structure; and a second current blocking layer of a buried ridge structure, which is placed to surround the environs of the first current blocking layer.

In accordance with another aspect of the present invention, there is provided a method for fabricating an optical device, including the steps of: a) forming active layers of a mesa structure in a predetermined region on a substrate; b) forming a first clad layer having a p-type along the surface of the active layers; c) forming a second clad layer having a n-type on the first clad layer by using the favorable condition of predominant side growth; d) exposing the first clad layer in the upper part of the active layers by etching the second clad layer; e) forming and planarizing a first conductive third clad layer in the upper part of the whole structure completed with the above four steps; and f) forming a current blocking layer by hydrogen ion implantation on the first clad layer and the second clad layer.

BRIEF DESCRIPTION OF THE DRAWING(S)

The above and other objects and features of the present invention will become apparent from the following description of the preferred embodiments given in conjunction with the accompanying drawings, in which.

FIGS. 3A to 3E are cross-sectional views showing a third method for fabricating a conventional optical device of a buried ridge structure having a current blocking layer using a hydrogen ion implantation method; and FIGS. 4A to 4F are cross-sectional views depicting a method for fabricating an optical device of a buried ridge structure having a P-N-P blocking layer or a current blocking layer using an ion implantation and combination in accordance with an embodiment of the present invention.

DETAILED DESCRIPTION OF THE INVENTION

Other objects and aspects of the invention will become apparent from the following description of the embodiments with reference to the accompanying drawings, which is set forth hereinafter.

With reference to FIGS. 4A to 4F, described hereinafter is a fabrication method of optical devices having a current blocking layer of a buried ridge structure in accordance with an embodiment of the present invention.

Figure 1A:
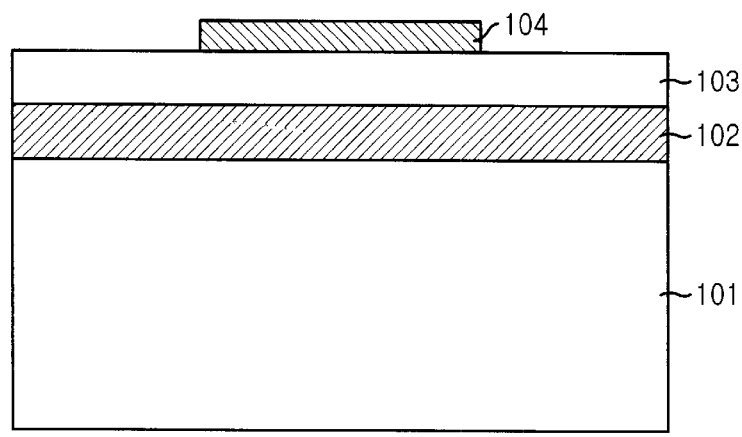
FIGS. 1A to 1E are cross-sectional views illustrating a first method for fabricating a conventional optical device of a planar buried heterostructure having a P-N-P current blocking layer.
Figure 1B:
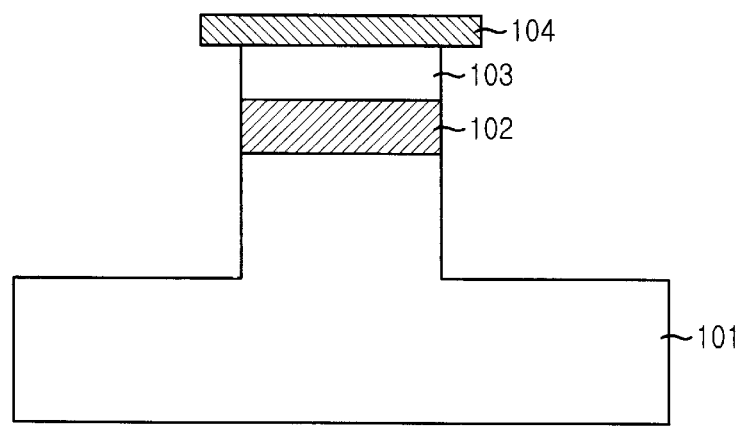
Figure 1C:
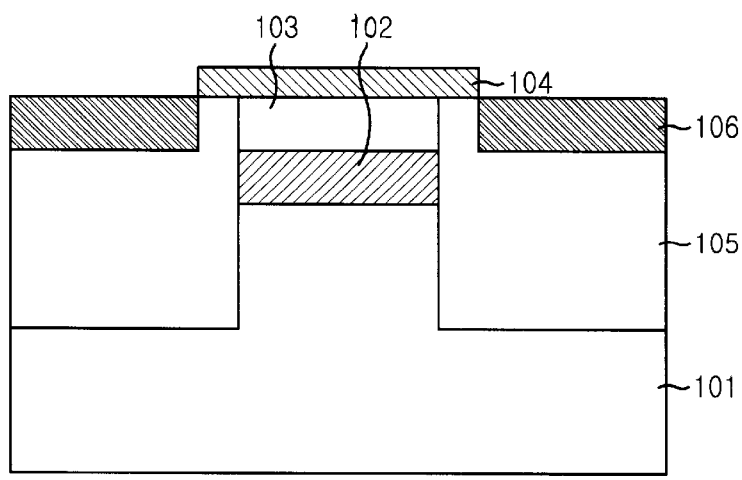
Figure 1D:
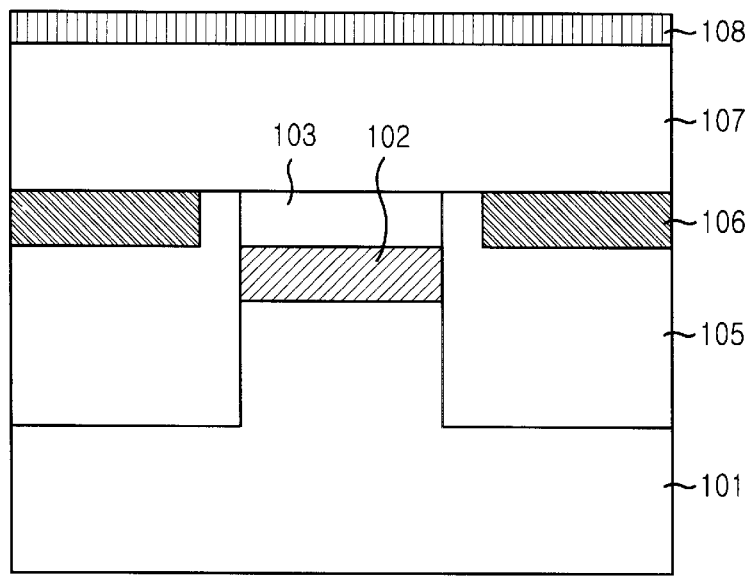
Figure 1E:
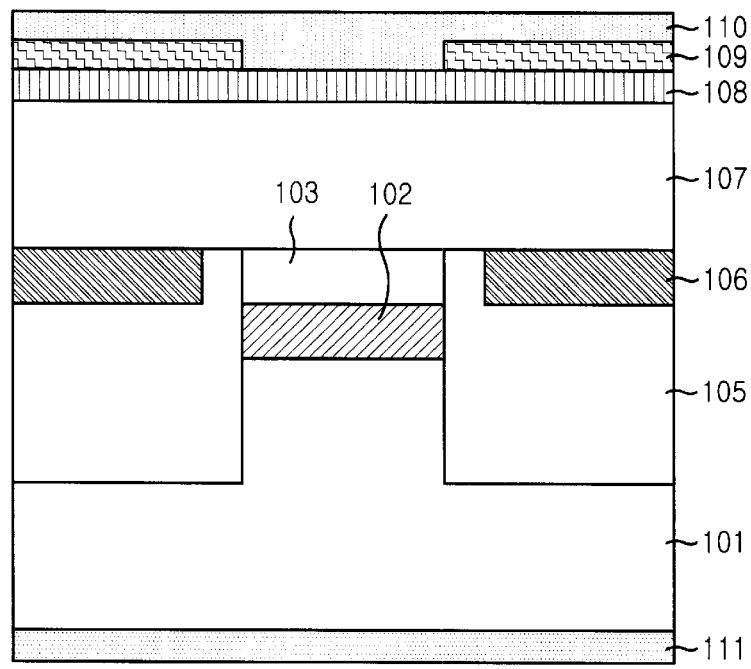
Figure 2A:
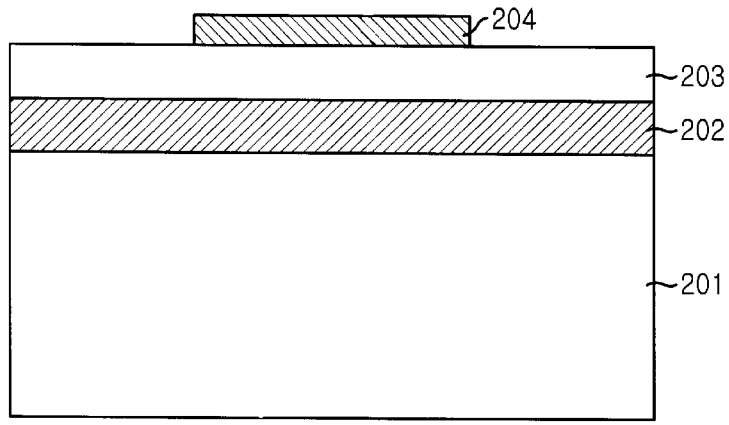
FIGS. 2A to 2E are cross-sectional views describing a second method for fabricating a conventional optical device of a planar buried heterostructure having a semi-insulated current blocking layer.
Figure 2B:
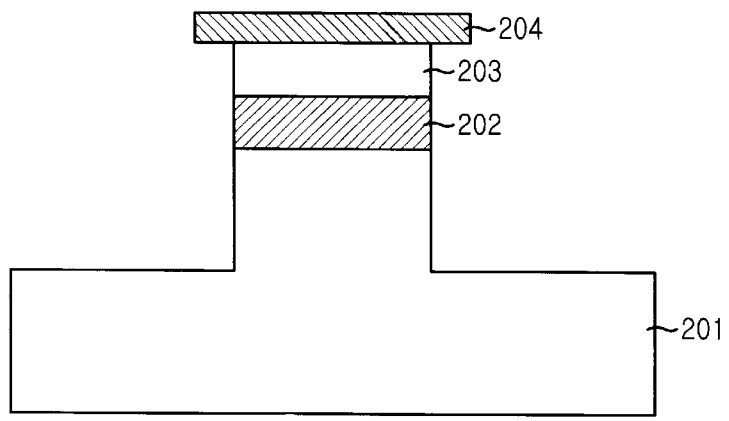
Figure 2C:
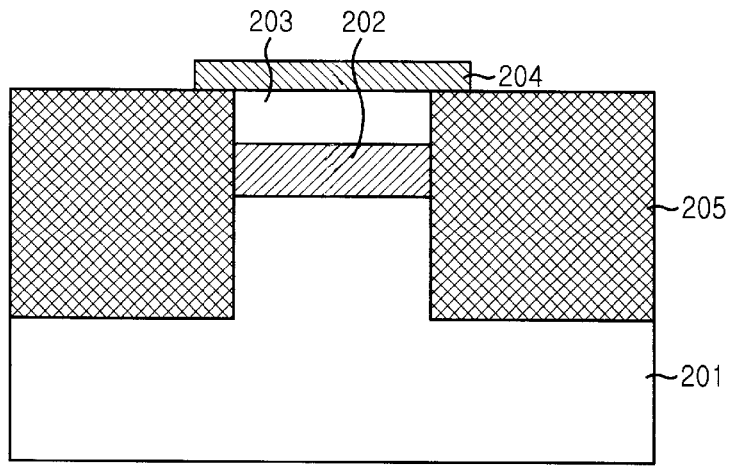
Figure 2D:
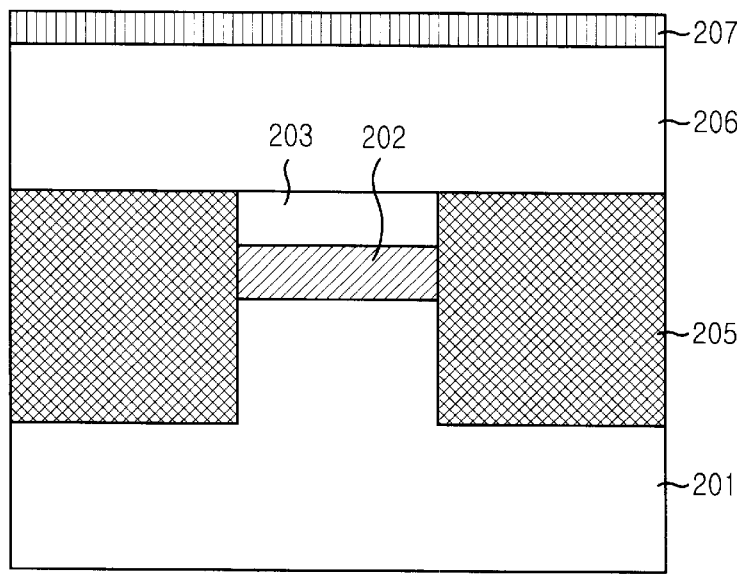
Figure 2E:
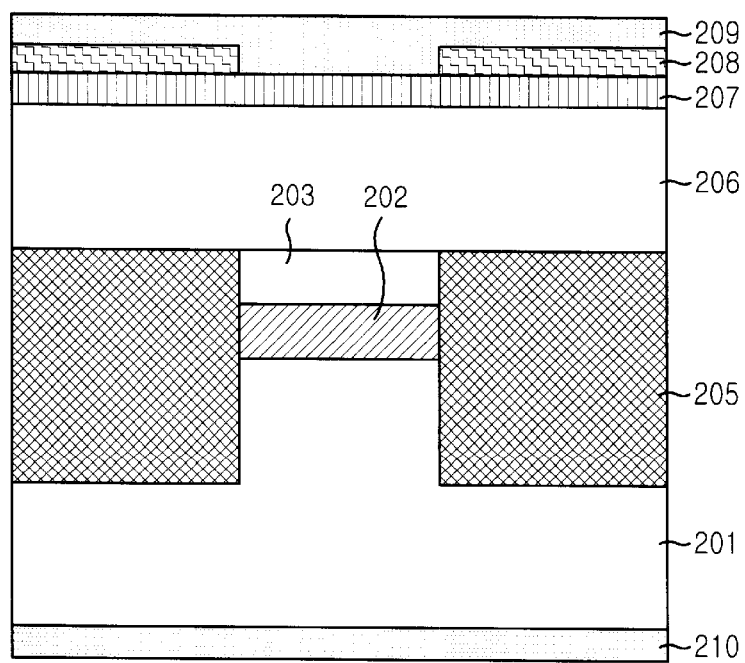
Figure 3A:
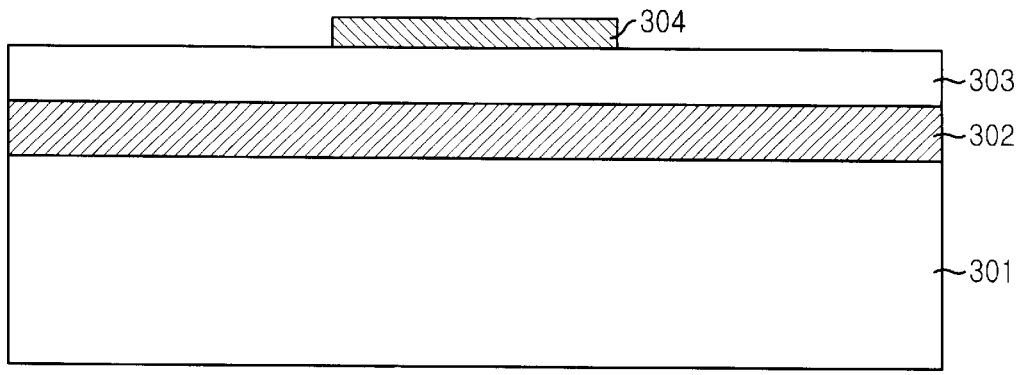
Figure 3B:
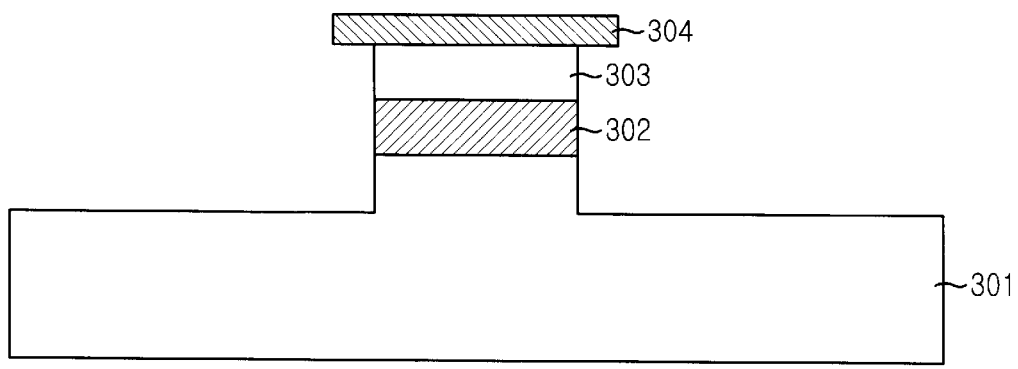
Figure 3C:
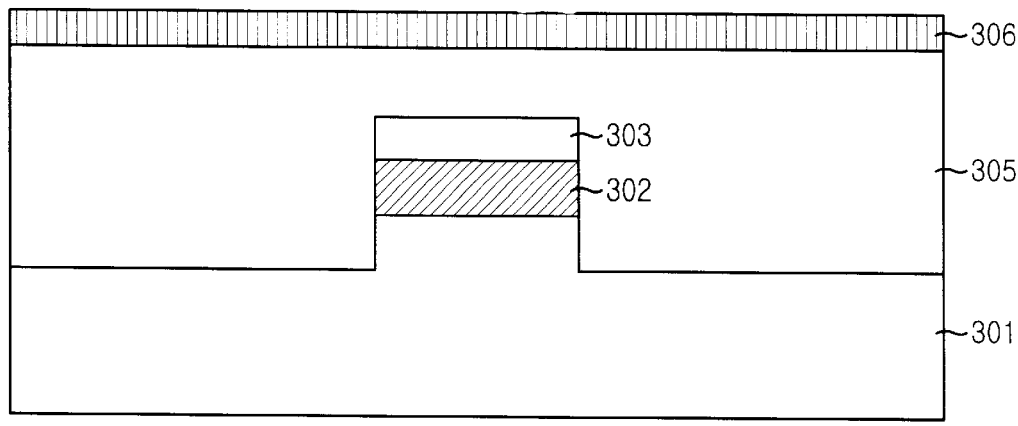
Figure 3D:
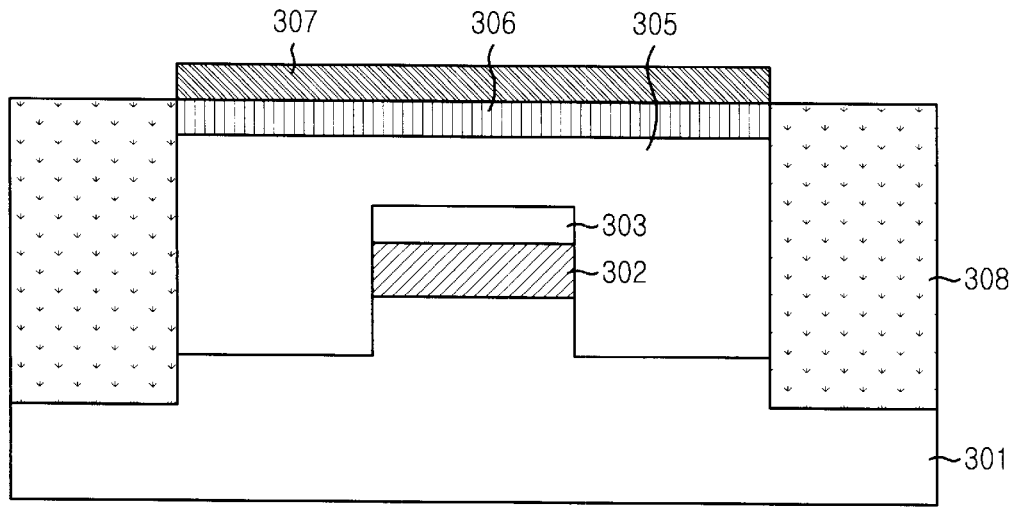
Figure 3E:
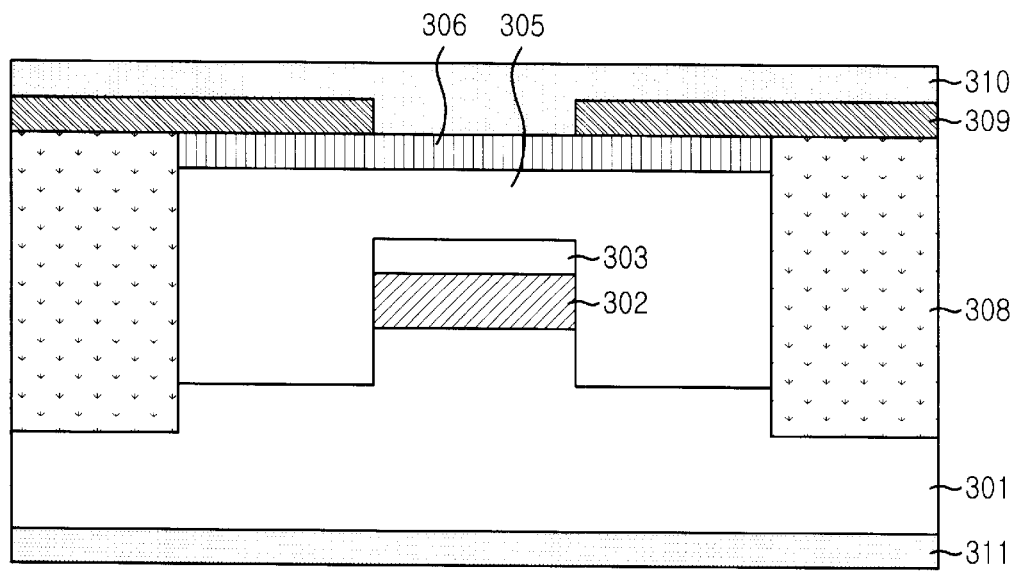
Figure 4A:
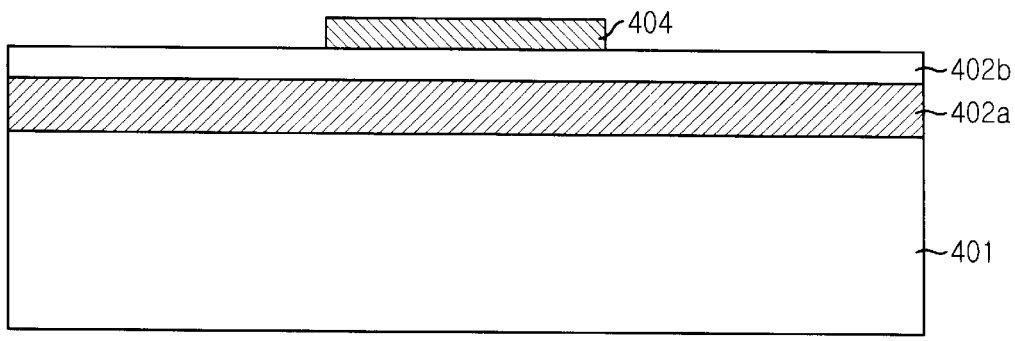

First, as illustrated in FIG. 4A, after an active layer 402A of an InGaAsP heterostructure and a p-InP layer 402B are formed on an n-InP substrate 401 in a metalorganic chemical vapor deposition (MOCVD) method, an insulation layer such as an oxidation layer or a nitride layer is deposited thereon and an insulation layer mask 404 for a mesa structure is formed through a photolithography etching process.

Figure 4B:
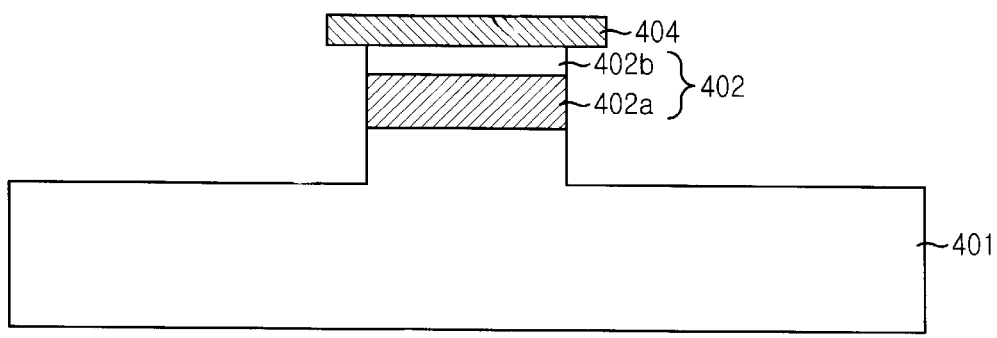

Subsequently, as shown in FIG. 4B, the active layers 402A and 402B and a part of the n-InP substrate 401 are etched by using the insulation layer mask 404, but the mesa structure is formed through the processes of dry-etching and wet-etching.

Figure 4C:
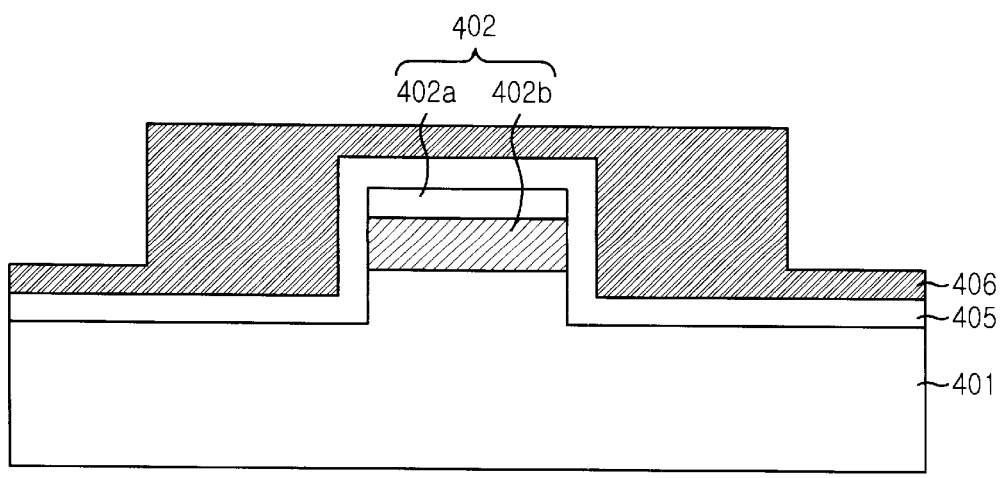

Subsequently, as depicted in FIG. 4C, after removing the insulation layer mask 404, a p-InP clad layer 405 of a predetermined thickness is grown on the entire surface of the substrate and an n-InP clad layer 406 is grown on the p-InP clad layer 405 of a mesa structure by using the favorable condition of predominant side growth.

Here, the growing temperature is controlled at 610~620° C. so that the p-InP clad layer 405 could maintain the mesa structure. As the growing temperature is kept at a low 550~590° C., the thickness of a part far from the side of the mesa structure is thin. However, to a predetermined length from the side of the mesa structure, the n-InP clad layer 406 of a considerable thickness can be obtained. For example, in case of growing the n-InP clad layer in a MOCVD method at the low temperature, the sides of the mesa structure can be grown 10 times as thick as a normal growth.

Figure 4D:
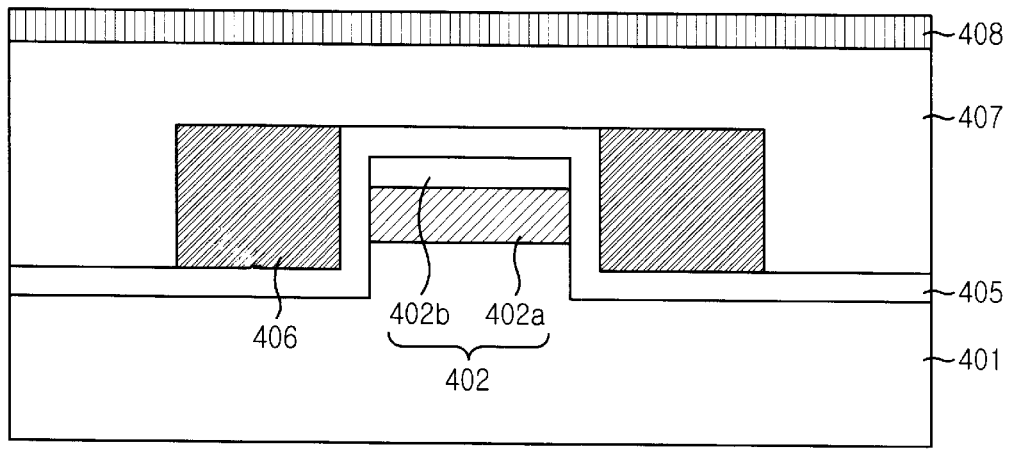

Subsequently, as illustrated in FIG. 4D, a wet-etching process is performed until the n-InP clad layer 406 on top of the mesa structure is removed entirely without any special mask process, and a p-InP clad layer 407 is grown on the entire surface and planarized. Through the processes, a first current blocking layer 500 of a P-N-P structure is formed in the mesa structure and its neighboring region. Then, a p-InGaAs is grown thereon and an ohm(Ω) contact layer 408 is formed.

Figure 4E:
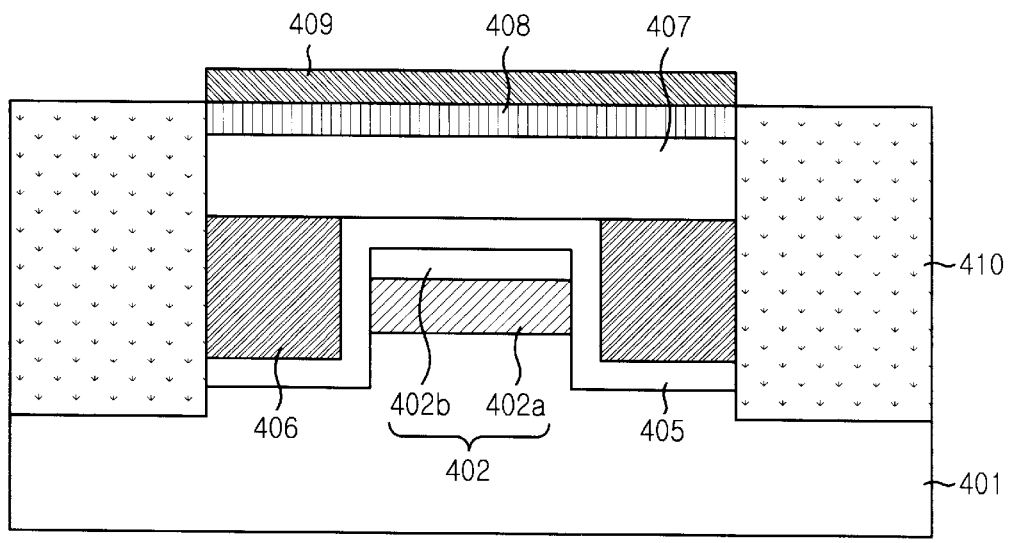

Subsequently, as described in FIG. 4E, a second current blocking layer 410 is formed to surround the environs of the first current blocking layer 500 by forming a blocking mask 409 for hydrogen ion implantation, which is overlapped with the mesa structure and the upper part of the n-InP clad layer 406, on the upper part of the ohm(Ω) contact layer 408, and performing hydrogen ion implantation.

Figure 4F:
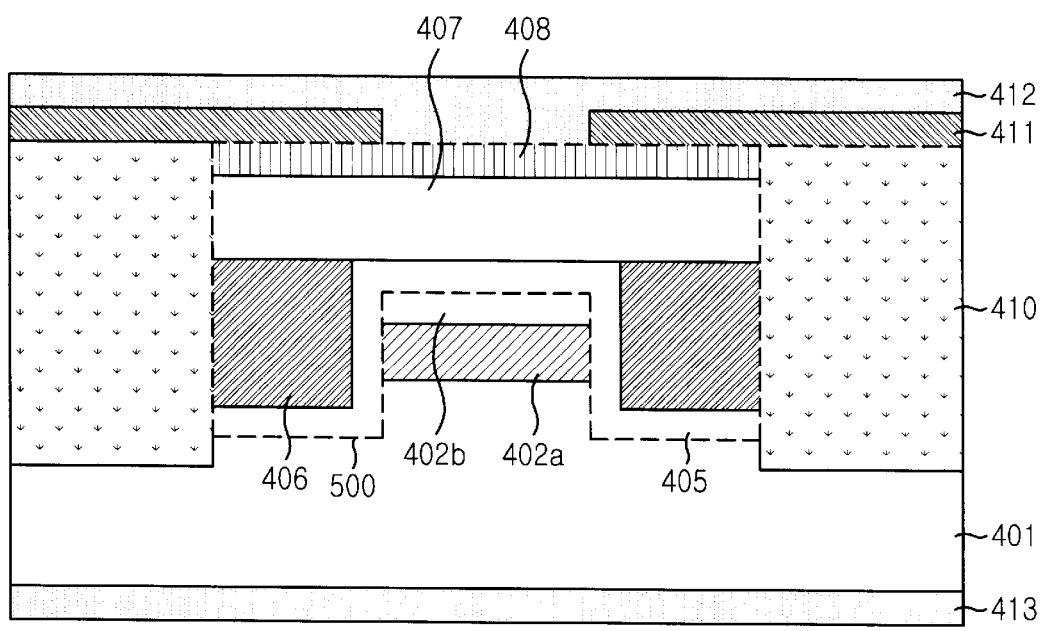

Subsequently, referring to FIG. 4F, it is illustrated a cross-sectional view of an optical device having a current blocking layer of a buried ridge structure in accordance with the present invention.

After removing the blocking mask 409 for hydrogen ion implantation, a dielectric layer 411 is deposited on the ohm(Ω) contact layer 408. Then, the region overlapped with the upper part of the active layers 402A and 402B is open by performing a photolithography and an etching, and a p-electrode 412 and an n-electrode 413 are formed to contact with the ohm(Ω) contact layer 408 and the n-InP substrate 401, respectively.

In other words, the optical device of an embodiment of the present invention includes: active layers 402A and 402B of a mesa structure in a predetermined region on an n-InP substrate 401; a first current blocking layer 500 of the P-N-P structure placed to cover the mesa structure; and a second current blocking layer 410 of a buried ridge structure placed to surround the environs of the first current blocking layer 500.

Here, the active layers 402A and 402B are of an InGaAsP heterostructure (402A) and a p-InP layer (402B), respectively. The first current blocking layer 500 includes: a first p-InP clad layer 405 that covers the mesa structure and the neighboring region thereof; an n-InP clad layer 406 placed to surround the mesa structure covered with the first p-InP clad layer 405 and the neighboring region thereof; and a second p-InP clad layer 407 placed to be overlapped with the upper part of the mesa structure and the n-InP clad layer 406.

The present invention basically uses a current blocking layer of a buried ridge structure using hydrogen ion implantation, but it is adopting a current blocking layer of a P-N-P structure that can minimize the amount of leakage current in the active layer and its neighboring region.

Therefore, it becomes possible to obtain a positive effect in the P-N-P re-growth, even when the waveguide is composed of a multiple numbers of layers in the vertical direction for the integration of an optical device, while minimizing leakage current.

Meanwhile, from a view point of fabrication processes, with complicated procedures being ruled out, the processes becomes simplified, thus heightening the process reproducibility.

The present invention described above can block a current effectively in a high-performance optical device of a multi-layer optical waveguide, or a structure where a plurality of optical devices are linked to each other on a single substrate.

Also, the present invention does not adopt any complicated new processes or ones that will adversely affect the reproducibility in forming a linked current blocking structure. It also eliminates processing variables by using the suppression and increase in the side growth according to growth conditions during the epitaxy. Further, this invention simplifies the fabrication process by adopting the etching process, which is conducted on the entire surface without using the mask or the photolithography etching.

While the present invention has been described with respect to certain preferred embodiments, it will be apparent to those skilled in the art that various changes and modifications may be made without departing from the scope of the invention as defined in the following claims.

For instance, the chemical compound semiconductors used in the above embodiment, such as InP and InGaAs can be replaced with other substances, and the polarity of the electric conduction can be formed differently, the p-type changed with the n-type.

Also, the hydrogen ion implantation for forming a current blocking structure can be replaced with a process doping other impurities.

What is claimed is:

1. A method for fabricating an optical device, comprising the steps of:
   a) forming active layers of a mesa structure in a predetermined region on a substrate;
   b) forming a first clad layer having a p-type along the surface of the active layers;
   c) forming a second clad layer having a n-type on the first clad layer by using the favorable condition of predominant side growth;
   d) exposing the first clad layer in the upper part of the active layers by etching the second clad layer;
   e) forming and planarizing a first conductive third clad layer in the upper part of the whole structure completed with the above four steps; and
   f) forming a current blocking layer by hydrogen ion implantation on the first clad layer and the second clad layer.

2. The method as recited in claim 1, wherein the step f) includes the steps of:
   f1) forming a blocking mask for ion implantation which covers the active layers and the second clad layer; and
   f2) performing hydrogen ion implantation by using the blocking mask for ion implantation.

3. The method as recited in claim 1, wherein the etching in the step d) is a wet etching.

* * * * *